(12) United States Patent
Wang et al.

(10) Patent No.: US 11,212,924 B2
(45) Date of Patent: Dec. 28, 2021

(54) DUSTPROOF DEVICE, DISPLAY APPARATUS AND DUSTPROOF METHOD

(71) Applicant: BOE TECHNOLOGY GROUP CO., LTD., Beijing (CN)

(72) Inventors: Zifeng Wang, Beijing (CN); Yan Ren, Beijing (CN); Lei Cao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 738 days.

(21) Appl. No.: 16/076,794

(22) PCT Filed: Feb. 8, 2018

(86) PCT No.: PCT/CN2018/075757
§ 371 (c)(1),
(2) Date: Aug. 9, 2018

(87) PCT Pub. No.: WO2019/000956
PCT Pub. Date: Jan. 3, 2019

(65) Prior Publication Data
US 2021/0185833 A1 Jun. 17, 2021

(30) Foreign Application Priority Data
Jun. 27, 2017 (CN) .......................... 201710500118.4

(51) Int. Cl.
*H05K 5/00* (2006.01)
*H05K 5/02* (2006.01)

(52) U.S. Cl.
CPC ......... *H05K 5/0017* (2013.01); *H05K 5/0217* (2013.01)

(58) Field of Classification Search
CPC .... H05K 7/20181; H05K 5/0217; H05K 5/03; H05K 5/0017; B03C 3/017; G06F 1/1656; G02F 1/133308
See application file for complete search history.

(56) References Cited

U.S. PATENT DOCUMENTS 8,292,980 B2 * 10/2012 Yamagishi ................ B03C 3/28
55/354

FOREIGN PATENT DOCUMENTS

| CN | 201218883 Y | 4/2009 |
| CN | 101739899 A * | 6/2010 |
| CN | 101739899 A | 6/2010 |

(Continued)

OTHER PUBLICATIONS

International Search Report dated May 11, 2018 issued in corresponding International Application No. PCT/CN2018/075757.

(Continued)

*Primary Examiner* — James Wu
(74) *Attorney, Agent, or Firm* — Nath, Goldberg & Meyer; Joshua B. Goldberg

(57) ABSTRACT

The present invention provides a dustproof device, a display apparatus and a dustproof method. The dustproof device includes: an outer frame which comprises a bent portion configured to enclose an edge of the display apparatus, a first recessed portion and a second recessed portion being provided at a surface of the bent portion facing a display panel of the display apparatus; and a barrier component which is disposed between the bent portion and the display panel and movable between the first and second recessed portions as the display panel is moved.

18 Claims, 3 Drawing Sheets

(56) References Cited

FOREIGN PATENT DOCUMENTS

| | | | |
|---|---|---|---|
| CN | 101833189 | A | 9/2010 |
| CN | 101866589 | A | 10/2010 |
| CN | 202735622 | U | 2/2013 |
| CN | 105025205 | A | 11/2015 |
| CN | 107067973 | A | 8/2017 |
| JP | H9-22000 | A | 1/1997 |
| JP | H10-104598 | A | 4/1998 |
| JP | 2013-140281 | A | 7/2013 |

OTHER PUBLICATIONS

Office Action dated Jan. 4, 2019 issued in corresponding Chinese Application No. 201710500118.4.

* cited by examiner

DUSTPROOF DEVICE, DISPLAY APPARATUS AND DUSTPROOF METHOD

CROSS-REFERENCE TO RELATED APPLICATION

This is a National Phase Application filed under 35 U.S.C. 371 as a national stage of PCT/CN2018/075757, filed Feb. 8, 2018, an application claiming the benefit of Chinese Patent Application No. 201710500118.4 filed with the Chinese Intellectual Property Office on Jun. 27, 2017, the disclosure of which is incorporated herein in its entirety by reference.

TECHNICAL FIELD

The present disclosure relates to the technical field of display technology, and particularly relates to a dustproof device, a display apparatus and a dustproof method.

BACKGROUND

Currently, to prevent foreign matters or dust from entering the interior, conventional electronic display products on the market, such as mobile phones, PADs (Portable Android Devices), computers, televisions and the like, usually adopt certain dustproof designs.

However, existing dustproof devices are typically fixed dustproof devices, that is, a dustproof device does not move with a display panel. With the development of technology, however, display products are no longer merely a static display. For example, a flexible display panel may be bent at will. For such a display apparatus, after the display panel is moved or unfolded, a portion of the display panel that is originally in contact with the outside is stored inside the display apparatus so that a relative position of the display panel and a frame is changed. If the dustproof device is a fixed structure, it is impossible for it to effectively block foreign matters from the outside, and in case of a bad use environment, foreign matters may be brought into the display apparatus and damage the display apparatus.

SUMMARY

The present disclosure has been accomplished in order to at least partially solve the problems in the existing art. The present disclosure provides a dustproof device, a display apparatus and a dustproof method that can effectively prevent dust when a display panel is moved and bent.

According to an aspect of the disclosure, there is provided a dustproof device for preventing a foreign matter from entering a display apparatus, comprising:

an outer frame which comprises a bent portion configured to enclose an edge of the display apparatus, a first recessed portion and a second recessed portion being provided at a surface of the bent portion facing a display panel of the display apparatus; and a barrier component which is disposed between the bent portion and the display panel and movable between the first and second recessed portions as the display panel is moved.

A bottom wall of the first recessed portion may be a plane parallel to the display panel, and the barrier component may be received in the first recessed portion; and a bottom wall of the second recessed portion may be a slope inclined with respect to the display panel and connected to the bottom wall of the first recessed portion, a distance between an end of the bottom wall of the second recessed portion adjacent to an edge of the display apparatus and the display panel is smaller than a distance between the bottom wall of the first recessed portion and the display panel.

The barrier component may include a barrier portion configured to temporarily store a foreign matter and a barrier sheet configured to close an end of the barrier portion adjacent to the edge of the display apparatus.

The barrier sheet may be made of an elastic material.

The barrier portion may include a frame in a cuboid shape and a plurality of elongated moving parts, the frame has a side wall adjacent to the edge of the display apparatus and an opening opposite to the side wall, the plurality of elongated moving parts are filled in the frame in a matrix arrangement via the opening, a first end of the moving part passes through the side wall, and a second end of the moving part is adjacent to the opening; and the barrier sheet is disposed at a side of the side wall adjacent to the edge of the display apparatus, the moving part is movable in a moving direction of the display panel, and the first end is capable of abutting against the barrier sheet.

The moving part may include a linkage, a stop dog, and a limiting block configured to prevent the linkage from coming out of the side wall, the linkage passes through the side wall and is respectively connected to the stop dog and the limiting block, and a height of the stop dog is greater than a height of the linkage.

The barrier component may further include a first spacer disposed at a side of the barrier portion adjacent to the bent portion, and a second spacer disposed at a side of the barrier portion adjacent to the display panel; and the first and second spacers are made of a material capable of generating static electricity and adsorbing dust and particles.

The first and second spacers may be elastic.

An insulating layer may be disposed on the bottom wall of the second recessed portion.

The first recessed portion may have a side wall oriented toward the display panel in a direction perpendicular to the bottom wall of the first recessed portion.

The bottom wall and the side wall of the first recessed portion are both in contact with the first spacer, and a surface of the first recessed portion in contact with the first spacer comprises a metal material.

The bottom wall of the first recessed portion is not in contact with the first spacer while the side wall of the first recessed portion is in contact with the first spacer, and a surface of the first recessed portion in contact with the first spacer comprises a metal material.

According to another aspect of the disclosure, there is provided a display apparatus comprising the above mentioned dustproof device.

According to still another aspect of the disclosure, there is provided a dustproof method using the above mentioned dustproof device, the method comprising: when the display panel is moved, moving the barrier component with the display panel while limiting it by the first and second recessed portions.

The dustproof method may further include: when the barrier component is moved within a range of the second recessed portion, temporarily storing a first foreign matter by means of an end of the first spacer distal to the barrier sheet, and adsorbing the first foreign matter by means of static electricity generated by an insulating layer disposed on the bottom wall of the second recessed portion.

The dustproof method may further include: when the barrier component is moved from the first recessed portion to the second recessed portion, pushing the moving part toward the barrier sheet by a second foreign matter so that the second foreign matter is temporarily stored in the frame, wherein a volume of the second foreign matter is larger than a volume of the first foreign matter.

The dustproof method may further include: when the barrier component is moved from the second recessed portion toward the first recessed portion, resetting the moving part by the elastic force of the barrier sheet so that the second foreign matter is pushed out of the barrier component by the moving part.

The dustproof method may further include: after the barrier component enters the first recessed portion from the second recessed portion, releasing the static electricity in the first spacer to release the first foreign matter.

DETAILED DESCRIPTION

Hereinafter, technical solutions of the present disclosure will be clearly and completely described with reference to the accompanying drawings. Apparently, the described exemplary embodiments are only some but not all of the embodiments of the present disclosure. All other embodiments obtained by those of ordinary skill in the art based on an exemplary embodiment of the present disclosure without making any creative effort shall fall within the protection scope of the present disclosure.

Figure 1:
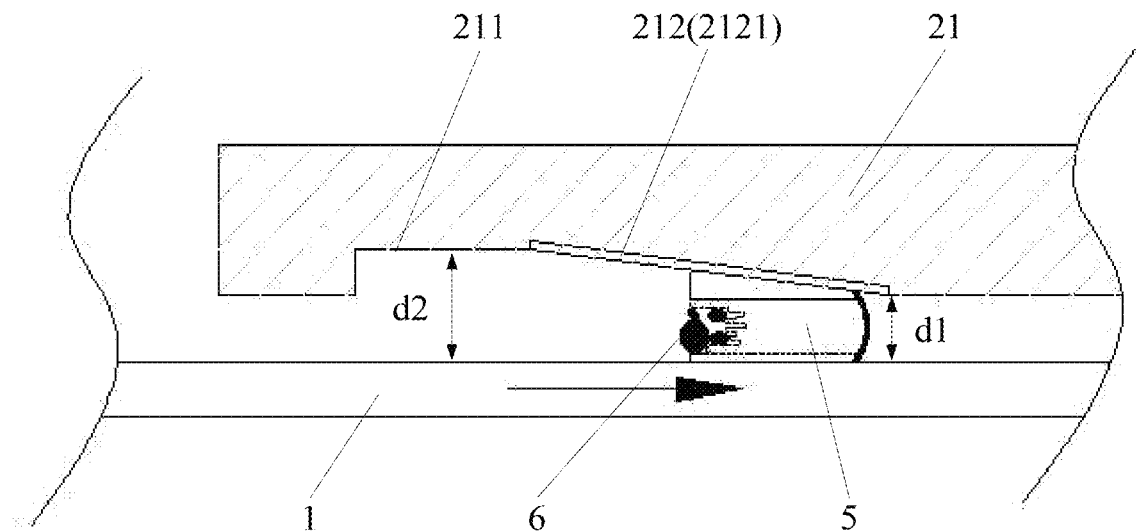
FIG. 1 is a schematic view showing the dustproof device blocking a foreign matter according to an exemplary embodiment of the disclosure.
Figure 2:
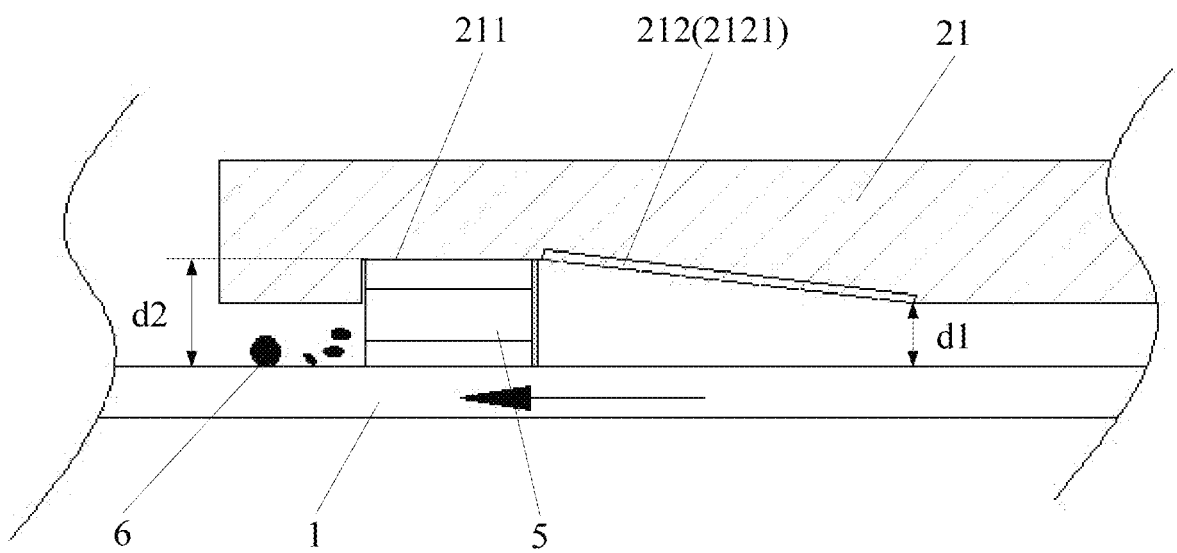
FIG. 2 is a schematic view showing the dustproof device releasing a foreign matter according to an exemplary embodiment of the disclosure.

As shown in FIGS. 1 and 2, the present disclosure provides a dustproof device for preventing a foreign matter from entering a display apparatus. The display apparatus includes a display panel 1. The dustproof device includes an outer frame having a bent portion 21 (only partly shown in FIGS. 1 and 2) at an edge of the display apparatus. An edge of the display panel 1 is located within a space formed by the bent portion 21 of the outer frame and a first recessed portion 211 and a second recessed portion 212 are provided at a surface of the bent portion 21 facing the display panel 1.

The dustproof device further includes a barrier component 5, which is disposed between the bent portion 21 and the display panel 1 and is movable between the first and second recessed portions 211, 212 as the display panel 1 is moved.

In some display apparatuses, the display panel 1 may be bent or moved along the outer frame, during which a relative position between the display panel 1 and the outer frame is to be changed. As shown in FIGS. 1 and 2, since a surface of the display panel 1 is not very smooth, a friction is present between the barrier component 5 and the display panel 1.

When the display panel 1 is moved along a direction as indicated by the arrow in FIG. 1, the barrier component 5 may be moved with the display panel 1 along the direction of the arrow, that is, the barrier component 5 is static to the display panel 1, but is movable to the bent portion 21. Specifically, the barrier component 5 is moved between the first and second recessed portions 211, 212. As shown in FIG. 1, while moving toward a right direction as shown, the barrier component 5 and the display panel 1 may be limited by the second recessed portion 212. As shown in FIG. 2, while moving toward a left direction as shown, the barrier component 5 and the display panel 1 may be limited by the first recessed portion 211.

A foreign matter 6, such as external dust, typically enters a space formed by the bent portion 21 and the display panel 1 at an opening of the bent portion 21 of the outer frame. Since the barrier component 5 may be limited by the first and second recessed portions 211, 212 when the display panel 1 is moved relative to the outer frame, the barrier component 5 may prevent the foreign matter 6, such as dust, from entering an interior of the display apparatus, thus realizing dynamic dustproofing.

In an exemplary embodiment of the disclosure, the dustproof device includes a barrier component 5 and an outer frame with a bent portion 21 having a first recessed portion 211 and a second recessed portion 212. The barrier component 5 is disposed between the bent portion 21 and a display panel 1. When the display panel 1 is moved along the outer frame, the barrier component 5 may be driven to move with the display panel 1 by means of a friction and limited by the first and second recessed portions 211, 212, thereby dynamically preventing an external foreign matter from entering the display apparatus. In the dustproof device according to the disclosure, a position of the barrier component 5 may be changed based on a change in a relative position between the display panel 1 and the outer frame, thereby realizing dynamic dustproofing, guaranteeing safety performance of electronic components inside the display apparatus, and enabling a better dustproof effect especially for a flexible display apparatus.

In an exemplary embodiment of the disclosure, as shown in FIGS. 1 and 2, the first recessed portion 211 has a bottom wall parallel to the display panel, and a side wall extending to the display panel in a direction perpendicular to the bottom wall, that is, the first recessed portion 211 is a recess disposed at a surface of the bent portion 21 facing the display panel 1. The barrier component 5 may be received in the first recessed portion 211 and limited by the side wall of the first recessed portion 211.

A bottom wall of the second recessed portion 212 is a slope inclined with respect to the display panel and connected to the bottom wall of the first recessed portion 211. In an exemplary embodiment of the disclosure, a distance d1 between an end of the bottom wall of the second recessed portion 212 adjacent to an edge of the display apparatus and the display panel 1 (i.e., a minimum distance between the second recessed portion 212 and the display panel 1) is smaller than a distance d2 between the bottom wall of the first recessed portion 211 and the display panel 1. That is, the second recessed portion 212 is located on a surface of the bent portion 21 facing the display panel 1, and is a downward slope toward the display panel 1. The barrier component 5 may be limited by an end of the second recessed portion 212 closest to the display panel 1.

In an exemplary embodiment of the disclosure, a distance between a bottom of the side wall of the first recessed portion 211 and the display panel 1 is also d1.

The structure of the barrier component 5 will be described in detail below with reference to FIGS. 1 to 4.

Figure 3:
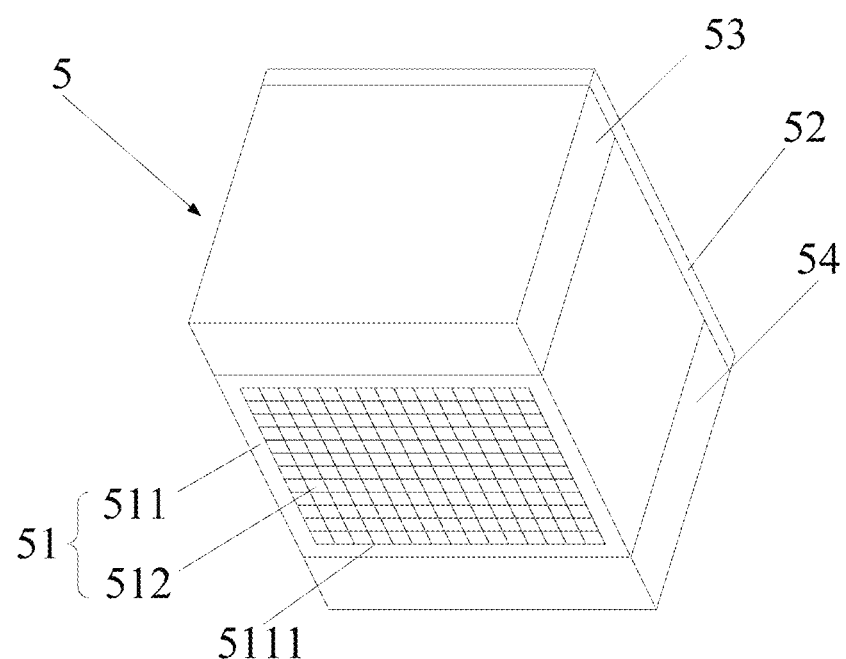
FIG. 3 is a schematic perspective view showing the barrier component according to an exemplary embodiment of the disclosure.
Figure 4:
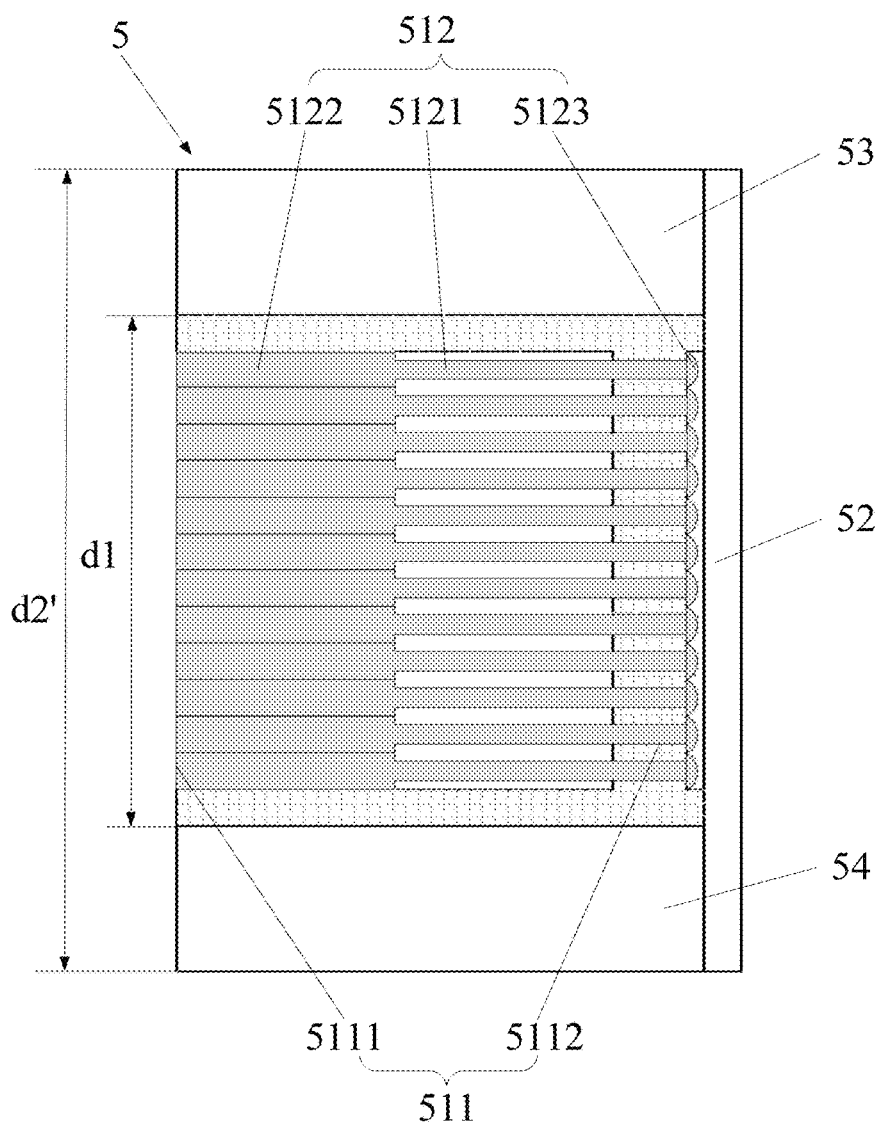
FIG. 4 is a schematic sectional view showing the barrier component according to an exemplary embodiment of the disclosure.

As shown in FIGS. 3 and 4, the barrier component 5 includes a barrier portion 51 configured to temporarily store a foreign matter and a barrier sheet 52 configured to close an end of the barrier portion 51 adjacent to the edge of the display apparatus.

As shown in FIG. 3, the barrier portion 51 includes a frame 511 in a cuboid shape and a plurality of elongated moving parts 512. The frame 511 has a side wall 5112 adjacent to the edge of the display apparatus and an opening 5111 opposite to the side wall 5112, that is, the frame 511 is a cuboid structure formed by five surfaces and one opening 5111. The plurality of elongated moving parts 512 are filled in the frame 511 in a matrix arrangement via the opening 5111.

A first end of the moving part 512 passes through the side wall 5112, and a second end of the moving part 512 is adjacent to the opening 5111. That is, the side wall 5112 and the opening 5111 of the frame face each other, the side wall 5112 is provided with the same number of holes in a matrix as the moving parts 512, and a distance from the opening 5111 to the side wall 5112 is substantially equal to a length of the moving part 512 so that the first end of the moving part 512 may pass through the hole while the second end is located just adjacent to the opening. It should be noted that the side wall 5112 should be ensured to have a certain thickness so that the side wall 5112 has a sufficient strength to bear the moving part 512.

As shown in FIG. 4, the barrier sheet 52 is elastic and disposed at a side of the side wall 5112 adjacent to the edge of the display apparatus. The moving part 512 may be moved along a moving direction of the display panel 1 and the first end of the moving part 512 may be abut against the barrier sheet 52.

In an exemplary embodiment of the disclosure, the moving part 512 includes a linkage 5121, a stop dog 5122, and a limiting block 5123. The linkage 5121 passes through the side wall 5112 of the frame 511 and is respectively connected to the stop dog 5122 and the limiting block 5123 for preventing the linkage 5121 from coming out of the side wall 5112. That is, the stop dog 5122 is located at the second end (adjacent to the opening 5111 of the frame 511) of the moving part 512, and the limiting block 5123 is located at the first end (adjacent to the side wall 5112 of the frame 511) of the moving part 512. A size of the hole in the side wall 5112 matches a size of the linkage 5121 and the linkage 5121 is slidable within the hole. As shown in FIG. 4, there is a gap between neighboring linkages 5121, that is, in a cross section parallel to the opening, a height of the stop dog 5122 is greater than a height of the linkage 5121, i.e., a connection portion between the stop dog 5112 and the linkage 5121 forms a stepped structure. When an external force is acted on the stop dog 5122, the moving part 512 is moved toward the barrier sheet 52 and the stepped structure at the connection portion between the stop dog 5112 and the linkage 5121 is abutted against the side wall 5112, thus limiting the moving part 512.

In an exemplary embodiment of the disclosure, the liming block 5123 is located at a side of side wall 5112 adjacent to the edge of the display apparatus, and a size of the limiting block 5123 is greater than the sizes of the linkage 5121 and the hole. Thus, under an external force, the limiting block 5123 may be engaged with the side wall 5112 so that the moving part 512 will not come out of the hole.

As shown in FIG. 1, when the barrier component 5 is located in the second recessed portion 212 to block the foreign matter 6, the foreign matter 6 pushes the moving part 512 to move so that the barrier sheet 52 is deformed and the foreign matter 6 is temporarily stored inside the frame 511. As shown in FIG. 2, during movement of the barrier component 5 from the second recessed portion 212 to the first recessed portion 211, an elastic force generated by a resilience of the barrier sheet 52 reversely pushes and resets the moving part 512. Thus, the foreign matter 6 may be pushed out of the frame 511 by the moving part 512 and fall onto the display panel 1 to fall off as the display panel 1 moves.

The barrier sheet 52 may close respective moving parts 512 to prevent the foreign matter 6 from entering the display apparatus. Meanwhile, the barrier sheet 52 may also provide the moving part 512 with an elastic force when springing back, thereby pushing the foreign matter 6 of a larger particle out of the frame 511.

In an exemplary embodiment of the disclosure, as shown in FIGS. 3 and 4, the barrier component 5 may further include a first spacer 53 disposed at a side of the barrier portion 51 adjacent to the bent portion 21, and a second spacer 54 disposed at a side of the barrier portion 51 adjacent to the display panel 1. Specifically, the first spacer 53 is disposed outside a top wall of the frame 511, the second spacer 54 is disposed outside a bottom wall of the frame 511, and the barrier sheet 52 covers a respective end of the first spacer 53 and the second spacer 54 adjacent to the edge of the display apparatus. In an exemplary embodiment of the disclosure, the first spacer 53 and the second spacer 54 are made of a material capable of generating static electricity and adsorbing dust and particles.

In an exemplary embodiment of the disclosure, the first spacer 53 and the second spacer 54 are elastic. As shown in FIG. 1, during the movement of the barrier component 5 toward the edge of the display apparatus in the second recessed portion 212, since a distance between the bent portion 21 and the display panel 1 is gradually reduced, the second recessed portion 212 presses the barrier component 5 so that the first spacer 53 and the second spacer 54 are compressed by force (compression deformation mainly occurs on the first spacer 53).

As shown in FIG. 4, a height of the barrier component 5 is d2', and a height of the frame 511 is d1. The minimum distance between the second recessed portion 212 and the display panel 1 is also d1, that is, even if the first spacer 53 and the second spacer 54 are both completely compressed, it is still not allowed to pass through the gap between the bent portion 21 and the display panel 1, so as to ensure that the second recessed portion 212 can effectively limit the barrier component 5.

In an exemplary embodiment of the disclosure, the first spacer 53 and the second spacer 54 may include a material of fiber cotton, which has a fiber section including a plurality of cavities and may include four-hole, seven-hole, nine-hole, or ten-hole cotton, or the like. During movement of the barrier component 5 along with the display panel 1, the first spacer 53 and the bent portion 21 of the outer frame, as well as the second spacer 54 and the display panel 1, generate static electricity by friction. The static electricity may adsorb fine dust and particles which may be temporarily stored in the cavities of the fiber cotton.

As shown in FIGS. 1 and 2, in an exemplary embodiment of the disclosure, an insulating layer 2121 may be further provided on a surface of the second recess 212. Thus, during movement of the barrier component 5 within a range of the second recessed portion 212, static electricity generated by the friction between the first spacer 53 and the insulating layer 2121 is continuously accumulated and temporarily isolated in the first spacer 53, thereby improving an adsorption effect of dust and particles.

The first spacer 53 and the second spacer 54 include a fiber material. When friction occurs, since static electricity may be easily accumulated in an insulating environment, and a structure of the fiber material is a mesh cotton body with many voids inside, after the static electricity is generated, some fine dust may be collected without scattering.

The bottom wall and the side wall of the first recessed portion 211, or the side wall of the first recessed portion 211, may be in contact with the first spacer 53 of the barrier component 5, and a surface of the first recessed portion 211 in contact with the first spacer 53 includes an antistatic material. Thus, during movement of the barrier component 5 within a range of the first recessed portion 211, the static electricity accumulated in the first spacer 53 may be released through the surface of the first recessed portion 211 (i.e., the side wall, or the bottom wall and the side wall) in contact with it. Thus, as shown in FIG. 2, due to a vibration generated by the movement of the display panel 1, dust and particles in the first spacer 53 may fall off at a side of the barrier portion 51 opposite to the barrier sheet 52 after the electrostatic adsorption force is lost.

When only the side wall of the first recessed portion 211 may be in contact with the first spacer 53 of the barrier component 5 (i.e., only the side wall of the first recessed portion 211 is in contact with a side surface of the first spacer 53, and the bottom wall of the first recessed portion 211 is not in contact with an upper surface of the first spacer 53), the distance d2 between the bottom wall of the first recessed portion 211 and the display panel 1 is greater than the height d2' of the barrier component 5. In this case, a contact area between the first spacer 53 and the first recessed portion 211 is smaller, thus leading to a not good electrostatic releasing effect.

When both the bottom wall and the side wall of the first recessed portion 211 may be in contact with the first spacer 53 of the barrier component 5 (i.e., the bottom wall of the first recessed portion 211 is in contact with the upper surface of the first spacer 53, and the side wall of the first recessed portion 211 is in contact with the side surface of the first spacer 53), the distance d2 between the bottom wall of the first recessed portion 211 and the display panel 1 is smaller than or equal to the height d2' of the barrier component 5. In this case, the contact area between the first spacer 53 and the first recessed portion 211 is larger, thus leading to a better electrostatic releasing effect.

Since the first recessed portion 211 is a part of the outer frame which usually needs to support and protect the display panel 1, the outer frame should have a certain strength. In order to balance the support, protection and static elimination functions, in an exemplary embodiment of the disclosure, the outer frame includes a metal material, and accordingly, the side wall and the bottom wall of the first recessed portion 211 also include a metal material.

A working process of the dustproof device of the disclosure will be described in detail below with reference to FIGS. 1 to 4.

When the display panel 1 enters the space formed by the bent portion 21, dust, particles, and the like on an upper surface of the display panel 1 will enter the space together. Since the upper surface of the display panel 1 cannot be completely flat, the barrier component 5 between the bent portion 21 and the display panels 1 will also be moved together (to the right). When the barrier component 5 is moved to a certain position of the second recessed portion 212, it cannot be moved further and thus is positioned there. At this time, the first spacer 53 has a smaller compression deformation on the left side, the mesh structure therein is opened, and the first spacer 53 has a larger compression deformation on the right side, the mesh structure therein is compressed. Thus, fine particle foreign matters such as dust are mainly concentrated at the left side of the first spacer 53. During the movement of the barrier component 5 within the range of the second recessed portion 212, the first spacer 53 rubs against the insulating layer 2121 to accumulate static electricity which may be temporarily isolated in the first spacer 53, thereby achieving a better adsorption effect of dust. At the same time, the foreign matter 6 of a larger particle may easily push the plurality of moving parts 512 to the right, while the foreign matter 6 is temporarily stored in the frame 511.

When the display panel 1 is retracted from the space formed by the bent portion 21, the barrier component 5 will also be moved together (to the left), that is, the barrier component 5 is moved from the second recessed portion 212 to the first recessed portion 211, and blocked by the side wall of the first recessed portion 211. During this process, the barrier sheet 52 provides a strong resilience force to push the moving part 512 back to the original position, thereby ejecting the foreign matter 6 entering the frame 511, causing it to fall onto the display panel 1, and thus falling off as the display panel 1 moves. For part of the dust in the first spacer 53, at this time, although the first spacer 53 has friction with the bottom wall of the first recessed portion 211, the generated static electricity is hard to accumulate, so the dust may also fall off with vibration of the display panel.

Figure 5:
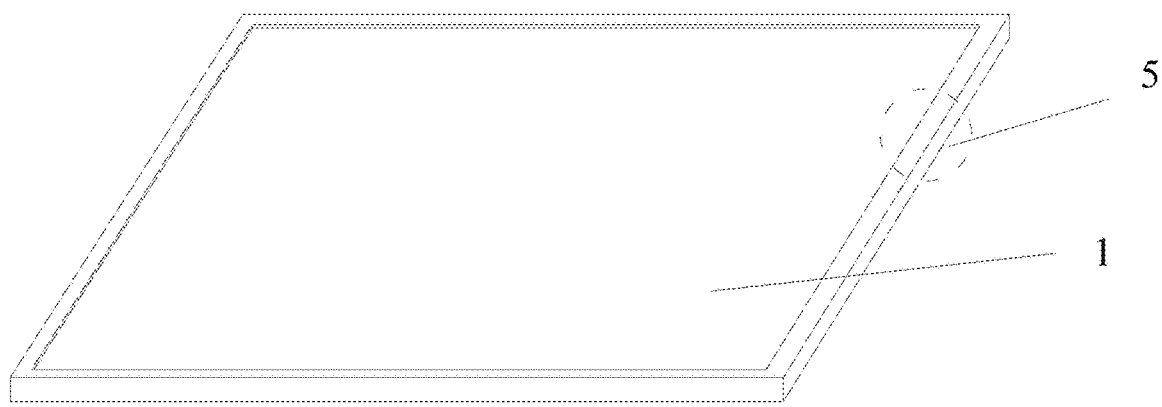
FIG. 5 is a structural schematic view showing the display apparatus according to an exemplary embodiment of the disclosure.

The present disclosure also provides a display apparatus as shown in FIG. 5, which includes a display panel 1 and a dustproof device as described above.

The display panel 1 may be a flexible display panel or a rigid display panel, and an edge of the display panel 1 may protrude into or out of a space formed by the bent portion 21.

The present disclosure also provides a dustproof method using the dustproof device as described above. As shown in FIGS. 1 to 4, the dustproof method includes:

when the display panel 1 is moved, moving the barrier component 5 with the display panel 1 while limiting it by the first recessed portion 211 and the second recessed portion 212.

In an exemplary embodiment of the disclosure, the dustproof method further includes:

when the barrier component 5 is moved within a range of the second recessed portion 212, temporarily storing a first foreign matter by means of an end of the first spacer 53 distal to the barrier sheet 52, and adsorbing the first foreign matter by means of static electricity generated with the insulating layer 2121.

In an exemplary embodiment of the disclosure, the dustproof method further includes:

when the barrier component 5 is moved from the first recessed portion 211 to the second recessed portion 212, pushing the moving part 512 toward the barrier sheet 52 by a second foreign matter so that the second foreign matter is temporarily stored in the frame 511.

It should be noted that a volume of the second foreign matter is larger than a volume of the first foreign matter, because the second foreign matter is usually a foreign matter of a larger particle, and the first foreign matter is usually a foreign matter of a smaller particle, such as dust or the like.

In an exemplary embodiment of the disclosure, the dustproof method further includes:

when the barrier component is moved from the second recessed portion toward the first recessed portion, resetting the moving part by the barrier sheet via its own elastic force so that the second foreign matter is pushed out of the barrier component by the moving part.

In an exemplary embodiment of the disclosure, the dustproof method further includes:

after the barrier component 5 enters the first recessed portion 211 from the second recessed portion 212, releasing static electricity in the first spacer 53 to release the first foreign matter.

The dustproof device of the disclosure includes a barrier component 5 and an outer frame with a bent portion 21 having a first recessed portion 211 and a second recessed portion 212, the barrier component 5 is disposed between the bent portion 21 and a display panel 1, when the display panel 1 is moved along the outer frame, the barrier component 5 may be driven to move with the display panel 1 by means of a friction and limited by the first and second recessed portions 211, 212, thereby dynamically preventing an external foreign matter from entering the display apparatus. In the display apparatus according to the disclosure, a position of the barrier component 5 may be changed based on a change in a relative position between the display panel 1 and the outer frame, thereby realizing dynamic dustproofing, guaranteeing safety performance of electronic components inside the display apparatus, and enabling a better dustproof effect especially for a flexible display apparatus.

It should be understood that the above embodiments are merely exemplary embodiments for the purpose of illustrating the principle of the disclosure, and the disclosure is not limited thereto. Various modifications and improvements can be made by a person having ordinary skill in the art without departing from the spirit and essence of the disclosure. Accordingly, all of the modifications and improvements also fall into the protection scope of the disclosure.

What is claimed is:

1. A dustproof device for preventing a foreign matter from entering a display apparatus, comprising:
   an outer frame which comprises a bent portion configured to enclose an edge of the display apparatus, a first recessed portion and a second recessed portion being provided at a surface of the bent portion facing a display panel of the display apparatus; and
   a barrier component which is disposed between the bent portion and the display panel and movable between the first and second recessed portions as the display panel is moved.

2. The dustproof device according to claim 1, wherein
   a bottom wall of the first recessed portion is a plane parallel to the display panel, and the barrier component is receivable in the first recessed portion; and
   a bottom wall of the second recessed portion is a slope inclined with respect to the display panel and connected to the bottom wall of the first recessed portion, a distance between an end of the bottom wall of the second recessed portion adjacent to an edge of the display apparatus and the display panel is smaller than a distance between the bottom wall of the first recessed portion and the display panel.

3. The dustproof device according to claim 2, wherein
   the barrier component comprises a barrier portion configured to temporarily store the foreign matter and a barrier sheet configured to close an end of the barrier portion adjacent to the edge of the display apparatus.

4. The dustproof device according to claim 3, wherein the barrier sheet is made of an elastic material.

5. The dustproof device according to claim 3, wherein
   the barrier portion comprises a frame in a cuboid shape and a plurality of elongated moving parts, the frame has a side wall adjacent to the edge of the display apparatus and an opening opposite to the side wall, the plurality of elongated moving parts are filled in the frame in a matrix arrangement via the opening, a first end of each of the plurality of elongated moving parts passes through the side wall, and a second end of each of the plurality of elongated moving parts is adjacent to the opening; and
   the barrier sheet is disposed at a side of the side wall adjacent to the edge of the display apparatus, each of the plurality of elongated moving parts is movable in a moving direction of the display panel, and the first end is capable of abutting against the barrier sheet.

6. The dustproof device according to claim 5, wherein
   each of the plurality of elongated moving parts comprises a linkage, a stop dog, and a limiting block configured to prevent the linkage from coming out of the side wall, the linkage passes through the side wall and is respectively connected to the stop dog and the limiting block, and a height of the stop dog is greater than a height of the linkage.

7. The dustproof device according to claim 5, wherein
   the barrier component further comprises a first spacer disposed at a side of the barrier portion adjacent to the bent portion, and a second spacer disposed at a side of the barrier portion adjacent to the display panel; and
   the first and second spacers are made of a material capable of generating static electricity and adsorbing dust and particles.

8. The dustproof device according to claim 7, wherein the first and second spacers are elastic.

9. The dustproof device according to claim 7, wherein an insulating layer is disposed on the bottom wall of the second recessed portion.

10. The dustproof device according to claim 7, wherein the first recessed portion has a side wall oriented towards the display panel in a direction perpendicular to the bottom wall of the first recessed portion.

11. The dustproof device according to claim 10, wherein the bottom wall and the side wall of the first recessed portion are both in contact with the first spacer, and a surface of the first recessed portion in contact with the first spacer comprises a metal material.

12. The dustproof device according to claim 10, wherein the bottom wall of the first recessed portion is not in contact with the first spacer while the side wall of the first recessed portion is in contact with the first spacer, and a surface of the first recessed portion in contact with the first spacer comprises a metal material.

13. The display apparatus comprising the dustproof device according to claim 1.

14. A dustproof method using the dustproof device according to claim 7, the method comprising:
    when the display panel is moved, moving the barrier component with the display panel while limiting it by the first and second recessed portions.

15. The dustproof method according to claim 14, further comprising:
    when the barrier component is moved within a range of the second recessed portion, temporarily storing a first foreign matter of the foreign matter by means of an end of the first spacer distal to the barrier sheet, and adsorbing the first foreign matter of the foreign matter by means of static electricity generated with an insulating layer disposed on the bottom wall of the second recessed portion.

16. The dustproof method according to claim 15, further comprising:

when the barrier component is moved from the first recessed portion to the second recessed portion, pushing each of the plurality of elongated moving parts toward the barrier sheet by a second foreign matter of the foreign matter so that the second foreign matter of the foreign matter is temporarily stored in the frame, wherein a volume of the second foreign matter is larger than a volume of the first foreign matter.

17. The dustproof method according to claim 16, further comprising:

when the barrier component is moved from the second recessed portion toward the first recessed portion, resetting each of the plurality of elongated moving parts by the elastic force of the barrier sheet so that the second foreign matter is pushed out of the barrier component by each of the plurality of elongated moving parts.

18. The dustproof method according to claim 17, further comprising:

after the barrier component enters the first recessed portion from the second recessed portion, releasing the static electricity in the first spacer to release the first foreign matter.

\* \* \* \* \*